US007212065B2

(12) United States Patent
Kishishita (10) Patent No.: US 7,212,065 B2
(45) Date of Patent: May 1, 2007

(54) SEMICONDUCTOR INTEGRATED CIRCUIT DEVICE CAPABLE OF RESTRAINING VARIATIONS IN THE POWER SUPPLY POTENTIAL

(75) Inventor: Keisuke Kishishita, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 42 days.

(21) Appl. No.: 10/921,998

(22) Filed: Aug. 20, 2004

(65) Prior Publication Data
US 2005/0040879 A1   Feb. 24, 2005

(30) Foreign Application Priority Data
Aug. 21, 2003 (JP) ............ P. 2003-297123
May 27, 2004 (JP) ............ P. 2004-157181

(51) Int. Cl.
  *G05F 1/10*   (2006.01)
(52) U.S. Cl. ............... 327/534; 327/564
(58) Field of Classification Search ........ 327/530, 327/534, 535, 564, 565, 566
  See application file for complete search history.

(56) References Cited

U.S. PATENT DOCUMENTS

| | | | |
|---|---|---|---|
| 5,299,169 A * | 3/1994 | Miyamoto | 365/230.05 |
| 5,309,040 A * | 5/1994 | Nakano et al. | 327/566 |
| 5,781,062 A * | 7/1998 | Mashiko et al. | 327/544 |
| 6,433,584 B1 * | 8/2002 | Hatae | 326/80 |
| 6,570,439 B2 * | 5/2003 | Berthold | 327/544 |
| 6,737,903 B2 * | 5/2004 | Suzuki | 327/293 |
| 6,747,509 B2 * | 6/2004 | Horiguchi et al. | 327/544 |
| 2001/0022741 A1 | 9/2001 | Takeuchi et al. | |

FOREIGN PATENT DOCUMENTS

JP    5-21713    1/1993

* cited by examiner

*Primary Examiner*—Jeffrey Zweizig
(74) *Attorney, Agent, or Firm*—McDermott Will & Emery LLP (57) ABSTRACT

To restrain variations in the power supply potential caused among a plurality of integrated circuits as well as the voltage drop of the power supply potential that has reached each block. A semiconductor integrated circuit device is provided with integrated circuits as blocks 2–4, power supply wires 11–13 for supplying power supply potential VDD or ground potential GND from feeder terminals 5–10 to the blocks 2–4, a switch circuit 14 for connecting the power supply wire 11 and the power supply wire 12, and a switch circuit 15 for connecting the power supply wire 11 and the power supply wire 13. When the switch circuit 15 is turned on, for example, the power supply wire 11 and the power supply wire 13 of the block 2 and the block 4 are connected whereby to supply the power supply potential from the two power supply wires, so that power supply potential variation is restrained.

32 Claims, 5 Drawing Sheets

SEMICONDUCTOR INTEGRATED CIRCUIT DEVICE CAPABLE OF RESTRAINING VARIATIONS IN THE POWER SUPPLY POTENTIAL

BACKGROUND OF THE INVENTION

1. Field of the Invention

The present invention relates to a semiconductor integrated circuit device capable of restraining power supply voltage variation.

2. Description of the Related Art

With rapid progress of microtechnology, power consumption in the whole system tends to increase as the integration intensity of semiconductor integrated circuits increases in recent years. As the situation now stands, it has strongly been called for to lower power consumption in semiconductor integrated circuit devices As the technology of reducing power consumption, it is an applicable one to control the supply of power to a plurality of blocks formed on one semiconductor chip. With the control of the supply of power to the plurality of blocks, however, there develops a demand for the technology of supplying power uniformly to each block by restraining variations in the block-to-block power supply potential. In this case, the block means an assembly of circuits such as a logic circuit and a memory array consisting of a plurality of logical elements or memory elements like flip-flops and having a fixed function.

Figure 8:
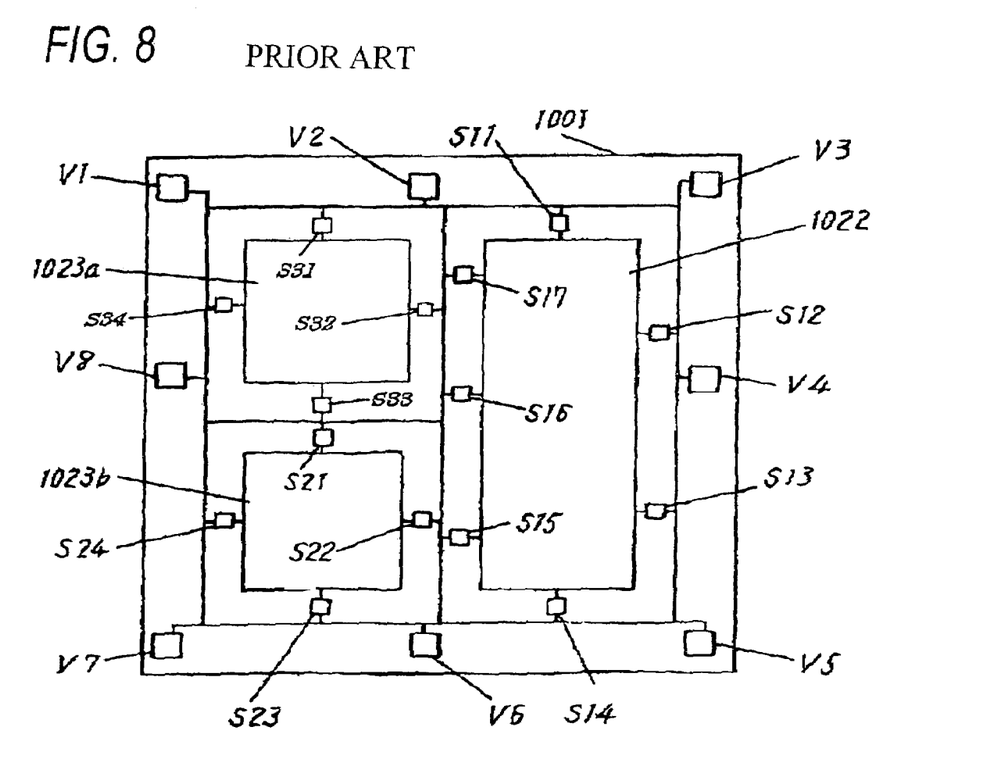
FIG. 8 is a plan view of a conventional semiconductor integrated circuit device.

As shown in FIG. 8, a conventional semiconductor integrated circuit device comprises a semiconductor chip 1001, a main system block 1022 around which power supply wiring is arranged, subsystem blocks 1023a and 1023b around which power supply wiring is also arranged, feeder terminals V1–V8, and switching elements S11–17 and S21–S24.

Figure 9:
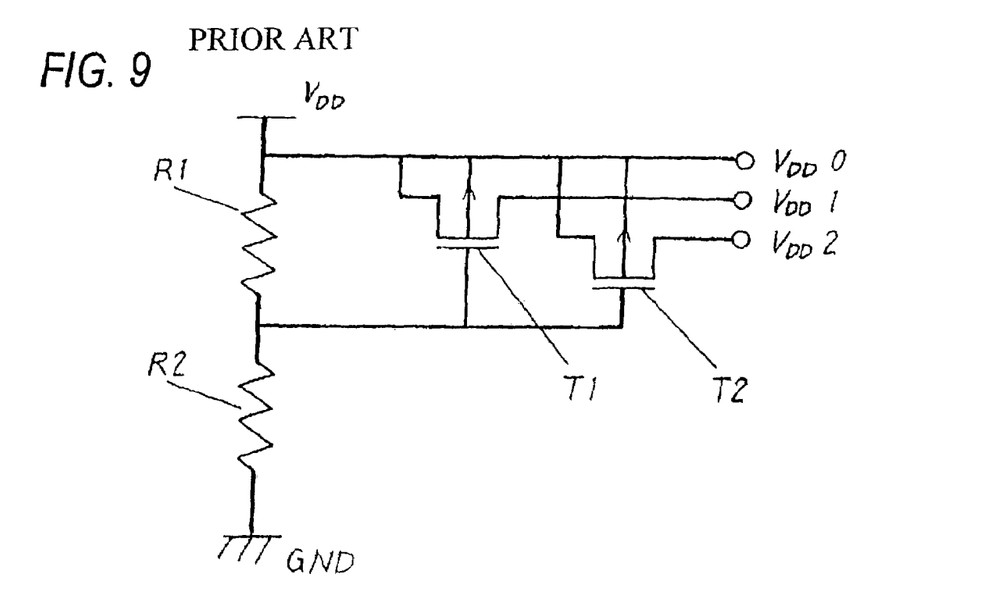
FIG. 9 is a circuit diagram of a conventional switching element.

As shown in FIG. 9, each of the switching elements S11–17 and S21–24 is formed with P-type MOS transistors T1 and T2, resistors R1 and R2 and output terminals $V_{DD}0$, $V_{DD}1$ and $V_{DD}2$.

In FIG. 8, power supply potential $V_{DD}$ is supplied via the switching elements S11–17 to the main system block 1022 formed on the semiconductor chip 1001 and the power supply potential $V_{DD}$ is supplied via the switching elements S21–24 to the subsystem block 1023b.

For example, it is assumed that the P-type MOS transistor T1 that forms each of the switching elements S21–24 sets a threshold voltage for turning on/off the channel at 0.75 V as the voltage applied across the gate-source and that the P-type MOS transistor T2 that forms each of the switching elements S11–17 sets a threshold voltage for turning on/off the channel at 1.0 V as the voltage applied across the gate-source.

Assuming that the potential difference between the power supply potential $V_{DD}$ and the ground potential GND is 4 V at this time, the voltage across the gate-source of each of the P-type MOS transistors T1 and T2 comes to 1.0 V, which results in turning on the P-type MOS transistor T1 and turning off the P-type MOS transistor T2. Consequently, the power supply potential $V_{DD}$ is supplied to the subsystem blocks 1023a and 1023b, so that each block becomes operated. However, the power supply potential $V_{DD}$ is not supplied to the main system block 1022, so that the main system block 1022 becomes unoperated.

Assuming that the potential difference between the power supply potential $V_{DD}$ and the ground potential GND is 5 V, the voltage across the gate-source of each of the P-type MOS transistors T1 and T2 comes to 1.25 V, which results in turning on the P-type MOS transistors T1 and T2. Consequently, the power supply potential $V_{DD}$ is supplied to the main system block 1022 and the subsystem blocks 1023a and 1023b, so that each block is operated.

Thus, the operating or unoperating condition of each block has been controlled by changing the value of one kind of power supply potential $V_{DD}$ supplied from the outside to turn on/off the switching elements S1–S24 connected to the power supply wires 1022, 1023a and 1023b, whereby the power consumption has been decreased by operating only the required block (see JP-A-5-21713 (pp 3–4, FIGS. 3–4) 1, for example).

With the above conventional arrangement, the blocks 1022 and 1023b are supplied with power invariably from the feeder terminals V1–V8 via the switching elements S11–17 and S21–24.

Consequently, a voltage drop occurs because of the resistance of the switching elements S11–17 and S21–24 when the power supply potential $V_{DD}$ is supplied to the feeder terminals V1–V8. When the power supply potential reaches each block, it has $V_{DD}-\alpha$ in the main system block 1022 and $V_{DD}-\beta (\alpha \neq \beta)$ in the subsystem block 1023b, for example, and as the power supply potential that reached the blocks attains different values, the problem in this case is that the block-to-block power supply potential tends to cause variation.

In order to reduce the voltage drop by means of the switching elements, it is needed to lower the resistance of the switching elements. Accordingly, a switching element formed with a P-type MOS transistor having a greater source-drain width has to be used and there is a problem arising from an increase in not only the size of the switching element but also the whole area of the semiconductor chip 100.

SUMMARY OF THE INVENTION

An object of the invention made to solve the foregoing problems is to provide a semiconductor integrated circuit device in which power is directly supplied from a feeder terminal to each block, and power is also supplied from another feeder terminal via a switch circuit disposed between the blocks whereby to restrain block-to-block power supply potential variation as well as the voltage drop of the power supply potential that has reached each block.

In order to solve the foregoing problems, a semiconductor integrated circuit device according to the invention has a plurality of blocks for use in dividing an integrated circuit, power supply wiring for supplying one of the two kinds of power supply potential to each block, and switch circuits for connecting at least two of the power supply wires.

It is thus possible to restrain variations in the block-to-block power supply potential as well as the voltage drop of the power supply potential that has reached each block.

With the semiconductor integrated circuit device according to the invention, it is possible to restrain variations in the block-to-block power supply potential as well as the voltage drop of the power supply potential within each block without increasing the area of a semiconductor chip.

DESCRIPTION OF THE PREPERRED EMIBODIMENTS

In order to accomplish the object above, a semiconductor integrated circuit device according to the invention has a plurality of blocks for use in dividing an integrated circuit, power supply wiring for supplying one of the two kinds of power supply potential to each block, and switch circuits for connecting at least two of the power supply wires, whereby it is possible to restrain variations in the block-to-block power supply potential as well as the voltage drop of the power supply potential that has reached each block.

As the switch circuit according to the invention is disposed between or in the vicinity of at least two of the blocks, any unnecessary drawing-around of power supply wiring is obviated and the switch-circuit arrangement area is minimized, so that an increase in the total area of the semiconductor chip because of the insertion of the switch circuit can be restrained.

The switch circuit according to the invention has power supply connection terminals for being connected to the power supply wiring, power supply connecting portions for controlling the condition of connecting the power supply connection terminals, and a control circuit for controlling the power supply connecting portions, whereby the condition of connecting the power supply connection terminals can be controlled by only the control circuit.

The control circuit according to the invention has control terminals and a NAND circuit, whereby the condition of connecting the power supply connection terminals can be controlled only by controlling the control terminals.

The control circuit according to the invention is so arranged as to control the power supply connecting portions, depending on the condition of the power supply potential supplied to the blocks, whereby the power supply connecting portions can be controlled without providing additional wiring to the control circuit from the outside.

The control circuit according to the invention is so arranged as to control the power supply connecting portions according to a block-to-block electric signal, whereby power consumption is restrained because the power supply connecting portions are not connected to the power supply wiring unless the electric signal is outputted from the block on one side.

As a P-type MOS transistor is used for forming the power supply connecting portion according to the invention, the switch circuit is formable with a smaller number of elements, so that the area of the semiconductor chip can be reduced.

A transfer gate may be used to form the power supply connecting portion according to the invention.

Even when at least one block is in a sleep mode condition according to the invention, power can be supplied from the block in the sleep mode condition to a block in operation via the switch circuit between the block in the sleep mode condition and the block in operation.

According to the invention, as at least two blocks are formed from a memory block which is controlled by the control block and a control block, a voltage drop can be restrained from being caused in a large memory block.

The switch circuit according to the invention has the power supply connection terminals connected to the power supply wiring, a capacitance generating portion for controlling the condition of connecting two of the power supply connection terminals, the control circuit for controlling the condition of connecting the capacitance generating portion to the power supply connection terminal, a first control terminal for controlling the condition of the capacitance generating portion, and a second control terminal for controlling the connection of the capacitance generating portion to the power supply connection terminal, whereby a gate capacitance is formable in the capacitance generating portion, so that power supply potential can stably be supplied to each block without necessitating providing a capacitance cell anew for stabilizing the power supply. Thus, it is possible to restrain variations in the block-to-block power supply potential as well as the voltage drop.

The switch circuit according to the invention has the power supply connection terminals connected to the power supply wiring, the capacitance generating portion for controlling the condition of connecting two of the power supply connection terminals, and the control circuit for controlling the condition of connecting the capacitance generating portion to the power supply connection terminal, whereby the power supply connection terminal is allowed to hold the control terminal for controlling the condition of the capacitance generating portion and the control terminal for controlling the connection between the capacitance generating portion and the power supply connection terminal in common, so that the number of elements as well as the area of the semiconductor chip is reducible because any other element than the power supply connection terminals can be dispensed with. Moreover, as the gate capacitance is formable in the capacitance generating portion, power supply potential can stably be supplied to each block without necessitating providing a capacitance cell anew for stabilizing the power supply. Thus, it is possible to restrain variations in the block-to-block power supply potential as well as the voltage drop.

A transfer gate may be used to form the capacitance generating portion according to the invention.

A transfer gate may also be used to form the control circuit according to the invention.

Since the invention is electronic equipment using a semiconductor integrated circuit device, power consumption can be reduced.

A description will now be given of embodiments of the invention by reference to the drawings.

(Embodiment 1)

Figure 1:
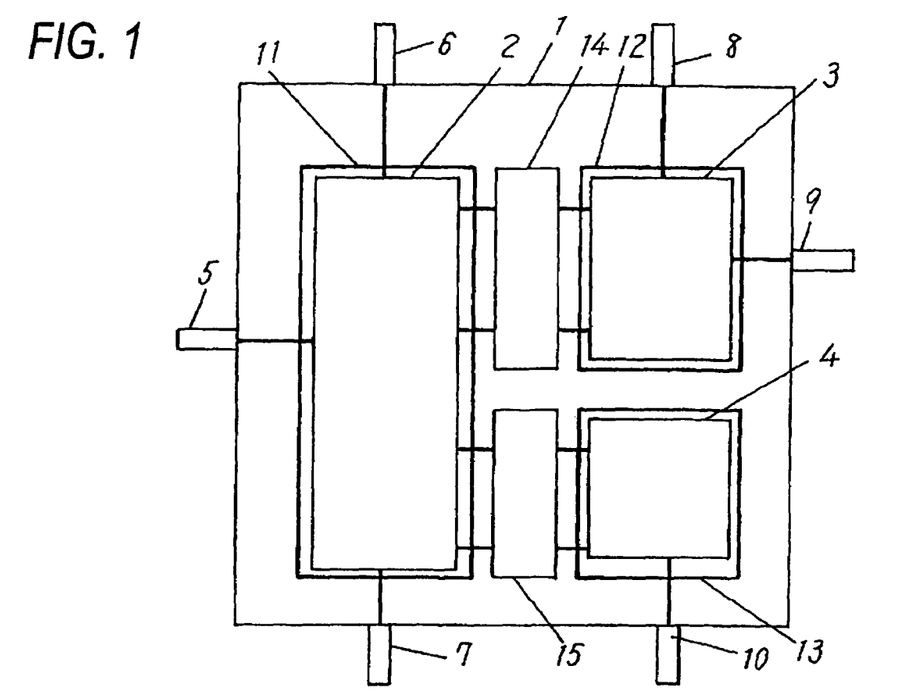
FIG. 1 is a plan view of a semiconductor integrated circuit device according to Embodiment 1 of the invention.
Figure 2:
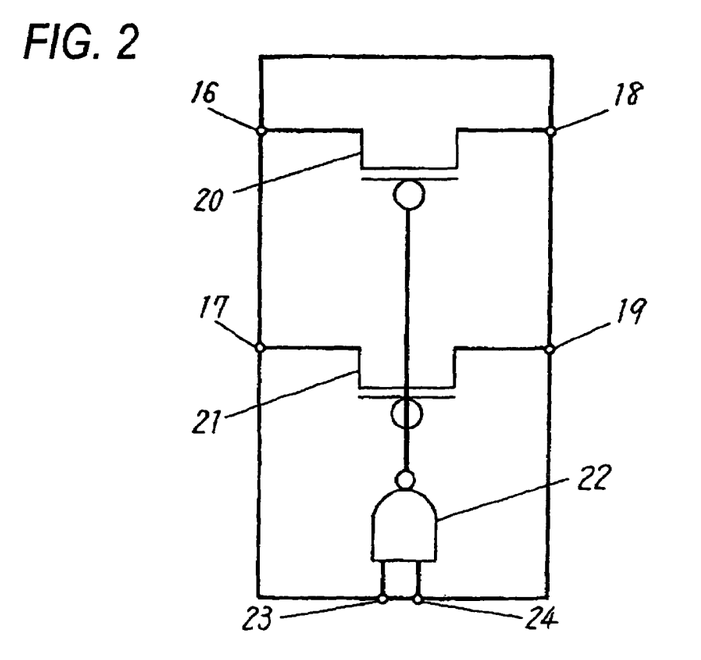
FIG. 2 is a circuit diagram of a switch circuit according to Embodiment 1 of the invention.

FIG. 1 is a plan view of a semiconductor integrated circuit device according to Embodiment 1 of the invention; and FIG. 2, a switch circuit diagram according to Embodiment 1 thereof.

As shown in FIG. 1, the semiconductor integrated circuit device comprises integrated circuits as blocks 2, 3 and 4 formed on a semiconductor chip 1, feeder terminals 5, 6, 7, 8, 9 and 10 for supplying power supply potential from the outside of the semiconductor chip 1, power supply wires 11, 12 and 13 independent of each other, for supplying the power supply potential from the feeder terminals 5, 6, 7, 8, 9 and 10 to the blocks 2, 3 and 4, and switch circuits 14 and 15 for connecting at least two of the power supply wires 11, 12 and 13.

As shown in FIG. 2, each of the switch circuits 14 and 15 comprises power supply connection terminals 16, 17, 18 and 19 for being connected to any one of the power supply wires 11, 12 and 13, P-type MOS transistors 20 and 21 as power supply connecting portions for controlling the condition of connecting the power supply connection terminals 16, 17, 18 and 19, a NAND circuit 22 as a control circuit for controlling the P-type MOS transistors 20 and 21, and control terminals 23 and 24 as input terminals for being connected to the NAND circuit 22.

In FIG. 1 and FIG. 2, further, the power supply wire 11 is used to connect the block 2 and the feeder terminals 5, 6 and 7; the power supply wire 12 is used to connect the block 3 and the feeder terminals 8 and 9; and the power supply wire 13 is used to connect the block 4 and the feeder terminal 10.

The switch circuit 14 is disposed between the block 2 and the block 3; the power supply connection terminals 16 and 17 and the control terminal 23 are connected to the power supply wire 11; and the power supply connection terminals 18 and 19 and the control terminal 24 are connected to the power supply wire 12.

On the other hand, the switch circuit 15 is disposed between the block 2 and the block 4; the power supply connection terminals 16 and 17 and the control terminal 23 are connected to the power supply wire 11; and the power supply connection terminals 18 and 19 and the control terminal 24 are connected to the power supply wire 13.

In the switch circuits 14 and 15, the output terminal of the NAND circuit 22 is connected to the gates of the P-type MOS transistors 20 and 21; and the sources-drains of the P-type MOS transistors 20 and 22 are connected to the power supply connection terminals 16, 17, 18 and 19, respectively.

With the arrangement above, power supply potential $V_{DD}$ is supplied to the block 2 and the block 4 via the power supply wires 11 and 13; and ground potential GND is supplied to the block 3 via the power supply wire 12.

At this time, the power supply potential $V_{DD}$ is inputted to the control terminal 22 of the switch circuit 15 from the control terminals 23 and 24 and the ground potential GND is outputted therefrom. Consequently, the P-type MOS transistors 20 and 21 are turned on, so that the power supply wire 11 and the power supply wire 13 are connected.

On the other hand, to the NAND circuit 22 of the switch circuit 14, the power supply potential $V_{DD}$ is supplied from the control terminal 23 and the ground potential GND is also supplied from the control terminal 24 with the power supply potential $V_{DD}$ outputted from the NAND circuit 22 thereof. Consequently, the P-type MOS transistors 20 and 21 is turned off, so that the power supply wire 11 and the power supply wire 12 are not connected.

In other words, the block 2 and the block 4 are in a connected condition, whereas the block 2 and the block 3 are in a non-connected condition.

When the power supply potential $V_{DD}$ is supplied to the power supply wires 11 and 13 of the block 2 and the block 4 as desired to be connected, the block-to-block power supply wiring becomes connectible via the switch circuit 15; in other words, an attempt to reduce power consumption is made feasible by switching only the necessary blocks to the operating condition.

Therefore, the voltage drop caused in the block up to the power supply connection terminals 16, 17, 18 and 19 from the feeder terminals 5, 6, 7 and 10 can be compensated for by the other power supply wire 11 or the other power supply wire 13 via the switch circuit 15, so that stable power supply potential can be supplied to the block.

The power supply potential of the block 2 and the block 4 thus connected is leveled off by disposing the switch circuit 15 between the blocks so as to restrain variations in the block-to-block power supply potential. Moreover, any unnecessary drawing-around of power supply wiring is obviated and the switch-circuit arrangement area is minimized, so that an increase in the area of the semiconductor chip can be restrained.

As a point of discontinuity of the block-to-block power supply potential is removable, timing verification of the operation of the semiconductor chip can readily be conducted.

Since the NAND circuit 22 and the control terminals 23 and 24 are used to form the control circuit with the control terminals 23 and 24 connected to the power supply wires 11, 12 and 13 according to this embodiment of the invention, the connection of the power supply connection terminals is made controllable by only controlling the control terminals 23 and 24 and the P-type MOS transistors 20 and 21 can be controlled without providing additional wiring to the control circuit from the outside.

Although there has been cited a case where the P-type MOS transistors 20 and 21 as the power supply connecting portions are controlled by the control circuit (the NAND circuit 22 and the control terminals 23 and 24), depending on the condition of the power supply potential supplied to the block according to this embodiment of the invention, another arrangement may be made by replacing the control circuit with a signal detecting portion, wherein when an electric signal is transmitted from one block to another block, the signal is detected by the signal detecting portion in order to switch the block-to-block relation to the connected condition so that the power supply connection terminals are connected by supplying the power supply potential to the block. Still another arrangement may be made so that the P-type MOS transistors 20 and 21 are controlled by introducing a control signal into the control terminals 23 and 24 from the outside.

Although two P-type MOS transistors have been shown in each of the switch circuits 14 and 15 by way of example according to this embodiment of the invention, only one or more than one P-type MOS transistor may also be employed.

Figure 3:
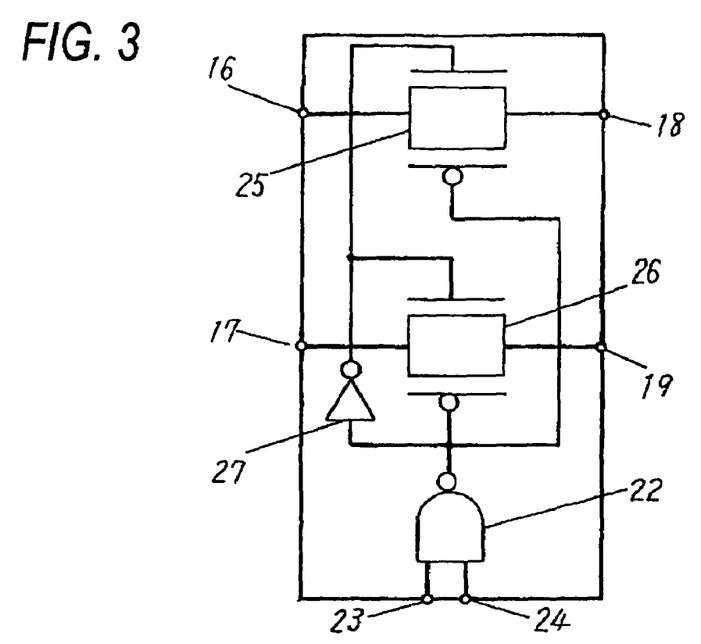
FIG. 3 is a circuit diagram of another switch circuit according to Embodiment 1 of the invention.

Further, transfer gates 25 and 26 and an invertor 27 in stead of the P-type MOS transistors 20 and 21 may be used to form each of the switch circuits 14 and 15 according to this embodiment of the invention as shown in FIG. 3 with the same effect being achievable. Moreover, another type of gates may also be used for the purpose.

(Embodiment 2)

Figure 4:
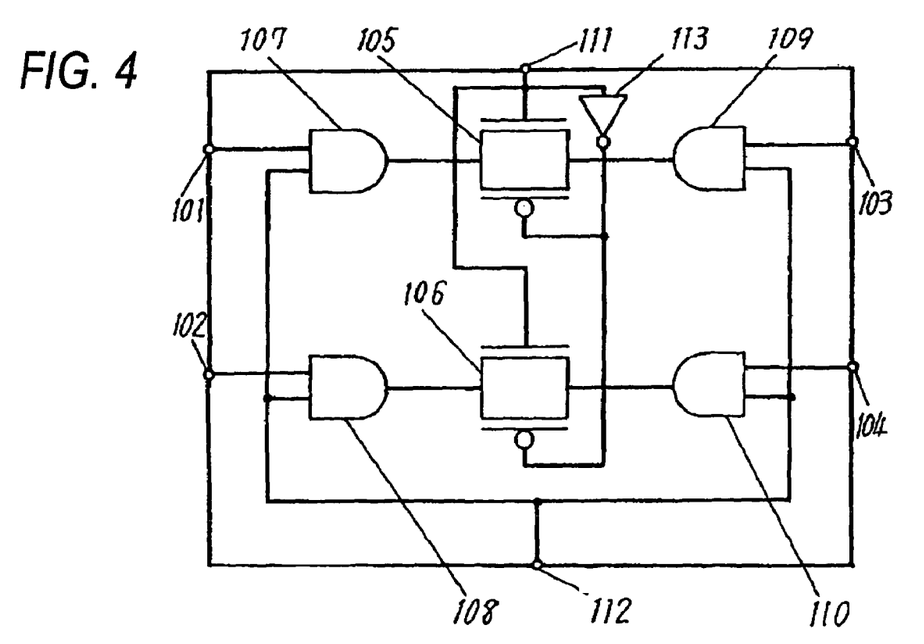
FIG. 4 is a circuit diagram of a switch circuit according to Embodiment 2 of the invention.

FIG. 4 refers to a case where a switch circuit is formed in a capacitance generating portion according to Embodiment 2 of the invention, wherein like structural elements in FIG. 1 excluding the switch circuit are given like reference characters and the description thereof will be omitted.

As shown in FIG. 4, each of the switch circuits 14 and 15 comprises power supply connection terminals 101, 102, 103 and 104 for being connected to any one of the power supply wires 11, 12 and 13, transfer gates 105 and 106 as capacitance generating portions for controlling the condition of connecting the power supply connection terminals 101, 102, 103 and 104, AND circuits 107, 108, 109 and 110 as control circuits for controlling the condition of connecting the transfer gates 105 and 106 to the power supply connection terminals 101, 102, 103 and 104, a first control terminal 111 for controlling the condition of the transfer gates 105 and 106, a second control terminal 112 for controlling the connection of the transfer gates 105 and 106 to the power supply connection terminals 101, 102, 103 and 104, and an invertor 113.

In FIG. 1 and FIG. 4, further, the switch circuit 14 is disposed between the block 2 and the block 3; the power supply connection terminals 101 and 102 and the first control terminal 111 are connected to the power supply wire 11; and the power supply connection terminals 103 and 104 are connected to the power supply wire 12.

On the other hand, the switch circuit 15 is disposed between the block 2 and the block 4; the power supply connection terminals 101 and 102 and the first control terminal 111 are connected to the power supply wire 11; and the power supply connection terminals 103 and 104 are connected to the power supply wire 13.

In the switch circuits 14 and 15, the input terminals on one sides of the AND circuits 107 and 108 are connected to the power supply connection terminals 101 and 102; the input terminals on the other sides of the AND circuits 107 and 108 are connected to the second control terminal 112; and the output terminals are connected to the sources or drains of the transfer gates 105 and 106. Moreover, the input terminals on one sides of the AND circuits 109 and 110 are connected to the power supply connection terminals 103 and 104; the input terminals on the other sides of the AND circuits 109 and 110 are connected to the second control terminal 112; and the output terminals of the AND circuits 109 and 110 are connected to the sources or drains of the transfer gates 105 and 106.

In the switch circuits 14 and 15, further, the gates of the N-type MOS transistors of the transfer gates 105 and 106 are connected to the first control terminal 111.

With the arrangement above., the power supply potential $V_{DD}$ is supplied from the feeder terminals 5, 6, 7 and 10 to the block 2 and the block 4 via the power supply wires 11 and 13; and the ground potential GND is supplied from the feeder terminals 8 and 9 to the block 3 via the power supply wire 12. Further, the ground potential GND is supplied to the second control terminal 112 of the switch circuit 14; and the power supply potential $V_{DD}$ is supplied to the second control terminal 112 of the switch circuit 15.

To the AND circuits 107, 108, 109 and 110 of the switch circuit 15, the power supply potential $V_{DD}$ is supplied from the power supply connection terminals 101, 102, 103 and 104 and from the second control terminal 112 and then the power supply potential $V_{DD}$ as the potential of the power supply wires 11 and 13 is outputted therefrom. The transfer gates 105 and 106 are turned on, so that the power supply wire 11 and the power supply wire 13 are connected. In other words, the block 2 and the block 4 are in a connected condition.

Further, the voltage drop caused in the block up to the power supply connection terminals 101, 102, 103 and 104 from the feeder terminals 5, 6, 7 and 10 can be compensated for by the other power supply wire 11 or the other power supply wire 13 via the switch circuit 15, so that stable power supply potential can be supplied to the blocks.

The power supply potential of the blocks thus connected is leveled off by disposing the switch circuit 15 between the blocks so as to restrain variations in the block-to-block power supply potential. Moreover, any unnecessary drawing-around of power supply wiring is obviated and the switch-circuit arrangement area is minimized, so that an increase in the area of the semiconductor chip can be restrained.

As the blocks are continuously connected without any variation in the block-to-block power supply potential, timing verification of the operation of the semiconductor chip can readily be conducted.

On the other hand, to the AND circuits 107 and 108 of the switch circuit 14, the power supply potential $V_{DD}$ is supplied from the power supply connection terminals 101 and 102 and the ground potential GND is supplied from the second control terminal 112 with the ground potential GND outputted from the AND circuits thereof. Further, the ground potential GND is supplied from the power supply connection terminals 103 and 104 and the second control terminal 112 to the AND circuits 109 and 110 with the ground potential GND outputted from the AND circuits. The sources-drains of the N-type MOS transistors of the transfer gates 105 and 106 and a substrate hold the ground potential GND and as the power supply potential $V_{DD}$ of the power supply wire 11 is applied to the gates, gate capacitance is generated beneath the gate oxide films of the N-type MOS transistors of the transfer gates 105 and 106.

Therefore, the switch circuit 14 is turned off and as the gate capacitance is generated though the power supply wire 11 and the power supply wire 12 are not connected, it is possible to stabilize the power supply potential of the block 2. In other words, the switch circuit can effectively be used by causing the gate capacitance to be generated even though it is in the off condition.

Since the transfer gates 105 and 106 as the capacitance generating portions are used for the switch circuits 14 and 15 as set forth above, the gate capacitance can be generated, so that the power supply potential is stably supplied to each block.

Further, capacitance cells heretofore provided need not be additionally provided for stabilizing the power supply potential by letting the switch circuits 14 and 15 have the capacitance generating function. The area of the semiconductor chip is thus reducible as the number of elements decreases thereby.

Even though the values of the power supply potential supplied to the power supply wires 11, 12 and 13 and the second control terminal 112 are varied according to this embodiment of the invention, it is possible to connect the power supply wires and to generate the gate capacitance depending on the condition of the potential of the power supply wires and that of the second control terminal with the same effect being achievable.

Figure 5:
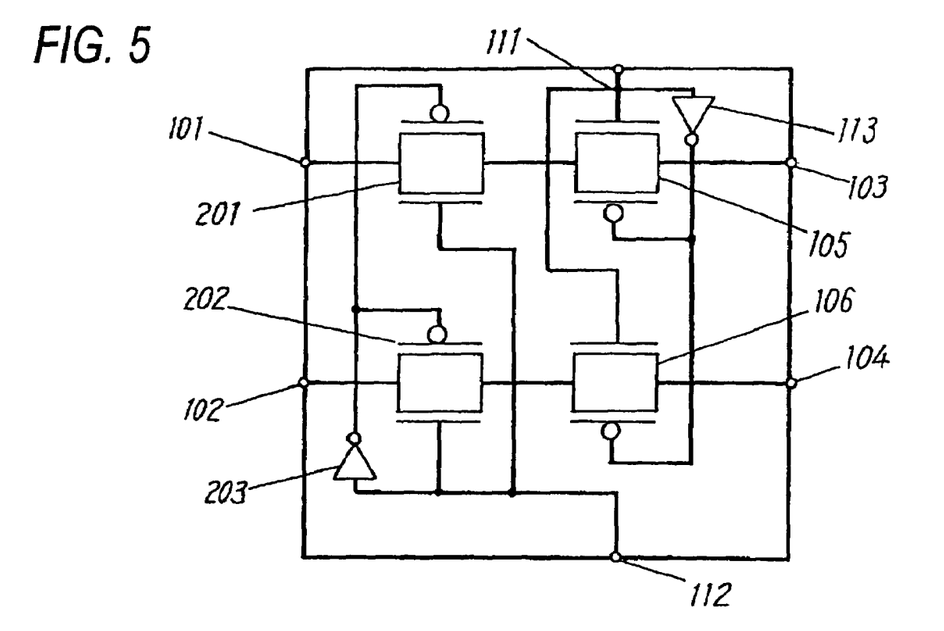
FIG. 5 is a circuit diagram of a switch circuit according to Embodiment 2 of the invention.

In the switch circuits 14 and 15 according to this embodiment of the invention, transfer gates may be used as the AND circuits 107, 108, 109 and 110. As shown in FIG. 5, moreover, the transfer gates 201 and 202, instead of the AND circuits 107, 108, 109 and 110, the invertor 203 and wiring may be used to form the switch circuit with the same effect being achievable. Moreover, any other gate may be used for the purpose.

Although two P-type MOS transistors have been shown in the switch circuits 14 and 15 by way of example according to this embodiment of the invention, only one or more than one P-type MOS transistor may also be used.

(Embodiment 3)

Figure 6:
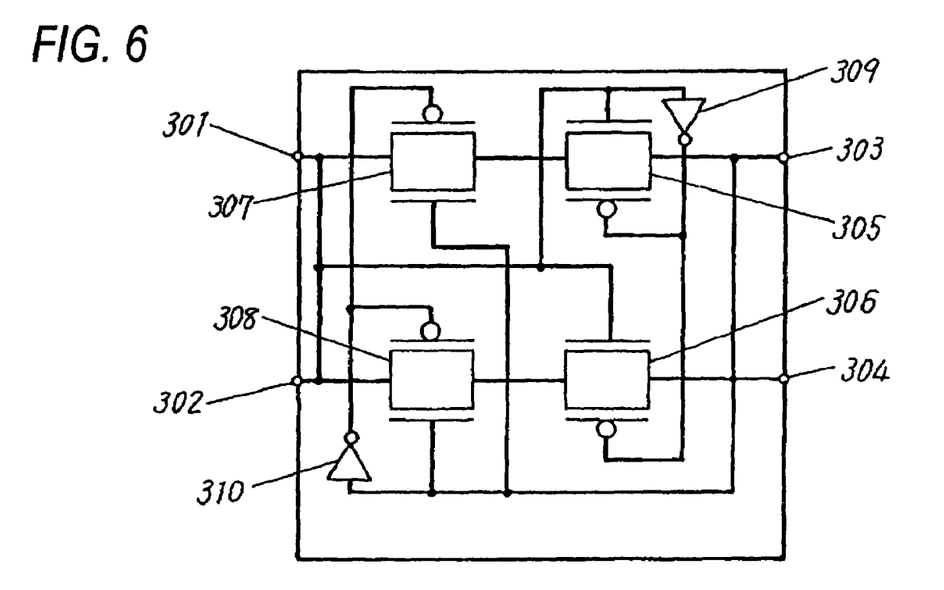
FIG. 6 is a circuit diagram of a switch circuit according to Embodiment 3 of the invention.

FIG. 6 shows a switch circuit arrangement according to Embodiment 3 of the invention, wherein like structural elements in FIG. 1 excluding the switch circuit are given like reference characters and the description thereof will be omitted.

As shown in FIG. 6, each of the switch circuits 14 and 15 comprises power supply connection terminals 301, 302, 303 and 304 for being connected to any one of the power supply wires 11, 12 and 13, transfer gates 305 and 306 as capacitance generating portions for controlling the condition of connecting the power supply connection terminals 101, 102, 103 and 104, transfer gates as control circuits 307 and 308 for controlling the condition of connecting the transfer gates 305 and 306 to the power supply connection terminals 301, 302, 303 and 304, and invertors 309 and 310.

In FIG. 1 and FIG. 6, the switch circuit 14 is disposed between the block 2 and the block 3; the power supply connection terminals 301 and 302 are connected to the power supply wire 11; and the power supply connection terminals 303 and 304 are connected to the power supply wire 12.

On the other hand, the switch circuit 15 is disposed between the block 2 and the block 4; the power supply connection terminals 301 and 302 are connected to the power supply wire 11; and the power supply connection terminals 303 and 304 are connected to the power supply wire 13.

In the switch circuits 14 and 15, the gates of the N-type MOS transistors of the transfer gates 305 and 306 are connected to the power supply connection terminals 301 and 302; and the gates of the N-type MOS transistors of the control circuits 303 and 304 are connected to the power supply connection terminals 303 and 304.

Drains or sources of the transfer gates 305 and 306 are connected to the power supply connection terminals 303 and 304; and the others thereof are connected to drains or sources of the N-type MOS transistors of the control circuits 307 and 308. Of the drains and sources of the N-type MOS transistors of the control circuits 307 and 308, those which are not connected to the transfer gates 305 and 306 are connected to the power supply connection terminals 301 and 302.

With the arrangement above, power supply potential $V_{DD}$ is supplied via the power supply wires 11 and 13 to the block 2 and the block 4; and the ground potential GND is supplied via the power supply wire 12 to the block 3.

At this time, the transfer gates 305 and 306 of the switch circuit 15 are turned on because the drain and source of the N-type MOS transistor are at the power supply potential $V_{DD}$, so that the power supply wire 11 and the power supply wire 13 are connected. In other words, the block 2 and the block 4 are in a connected condition.

Therefore, the voltage drop caused in the block up to the power supply connection terminals 301, 302, 303 and 304 from the feeder terminals 5, 6, 7 and 10 can be compensated for by the other power supply wire 11 or the other power supply wire 13 via the switch circuit 15, so that stable power supply potential can be supplied to the block. Moreover, power consumption due to the voltage drop is restrainable.

As the power supply potential of the blocks thus connected is leveled off by disposing the switch circuit 15 between the blocks, variations in the block-to-block power supply potential are restrainable. Further, as a point of discontinuity of the block-to-block power supply potential is removable, timing verification of the operation of the semiconductor chip can readily be conducted.

On the other hand, the control circuits 307 and 308 of the switch circuit 14 are turned off because the ground potential GND of the power supply wire 12 is applied to the gates of the N-type MOS transistors. Further, the sources-drains of the N-type MOS transistors of the transfer gates 305 and 306 and a substrate hold the ground potential GND and as the power supply potential $V_{DD}$ of the power supply wire 11 is applied to the gates, gate capacitance is generated beneath the gate oxide films of the N-type MOS transistors of the transfer gates 305 and 306.

Therefore, the switch circuit 14 is turned off and as the gate capacitance is generated though the power supply wire 11 and the power supply wire 12 are not connected, it is possible to stabilize the power supply potential of the block 2.

Since the transfer gates 305 and 306 as the capacitance generating portions are used for the switch circuits 14 and 15 as set forth above, the gate capacitance can be generated, so that the power supply potential is stably supplied to each block.

Further, capacitance cells heretofore provided need not be additionally provided for stabilizing the power supply potential by letting the switch circuits 14 and 15 have the capacitance generating function. The area of the semiconductor chip is thus reducible as the number of elements decreases thereby.

According to this embodiment of the invention, as the power supply connection terminals 301, 302, 303 and 304 are allowed to hold the first control terminal 111 for controlling the condition of the capacitance generating portion in FIG. 5 as well as the second control terminal 112 for controlling the connection between the capacitance generating portion and the power supply connection terminal in common, so that the number of elements is reducible.

(Embodiment 4)

Figure 7:
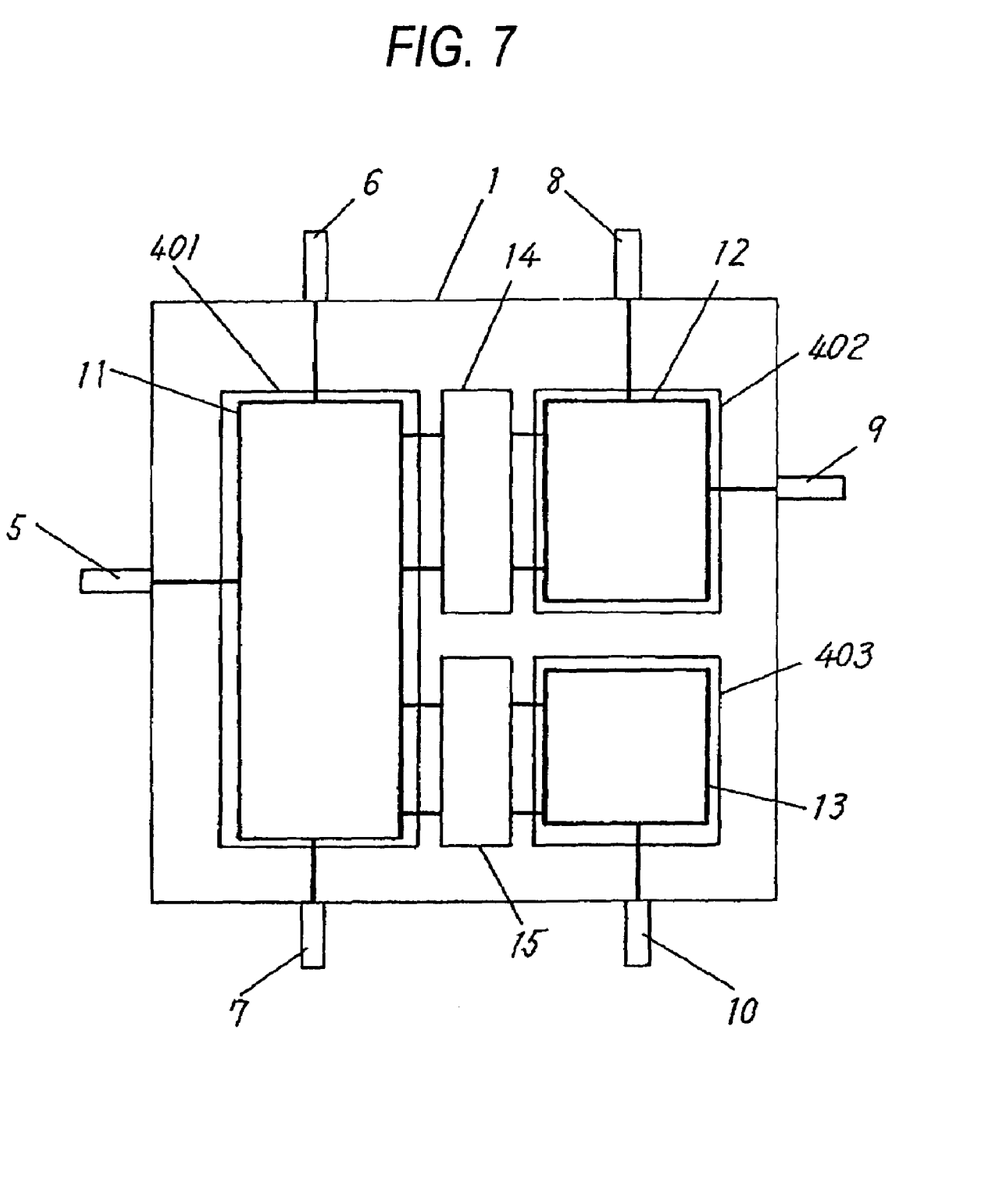
FIG. 7 is a plan view of a semiconductor integrated circuit device according to Embodiment 4 of the invention.

FIG. 7 shows Embodiment 4 of the invention, wherein like structural elements in FIG. 1 are given like reference characters and the description thereof will be omitted.

As shown in FIG. 7, the integrated circuits as the blocks 2, 3 and 4 formed on the semiconductor chip 1 shown in FIG. 1 may be replaced with a control block 401 and memory blocks 402 and 403 which is controlled by the control block.

In this case, restraining the voltage drop caused inside large-area memory blocks 402 and 403 is proved effective.

Further, lowering of power consumption is realizable because the read/write memory and the control block 401 can be connected together via the switch circuit.

Incidentally, even when at least one block is in a sleep mode condition according to the above embodiments of the invention, that is, in such a condition that no block-to-block signal exchange is carried out though the power supply potential is being supplied, power can be supplied to a block operating via the switch circuit.

Although the $V_{DD}$ and the ground potential GND, for example, have been referred to as the two kinds of power supply potential according to the above embodiments of the invention, any two kinds of power supply potential are applicable.

Although there have been indicated cases where one to three feeder terminals toward the respective blocks according to the above embodiments of the invention, power supply voltage variation is obviously restrainable by only one feeder terminal. Moreover, there may be provided not less than three feeder terminals and the voltage drop is made reducible further in this case.

According to the above embodiments of the invention, the number of integrated circuits as the blocks formed on the semiconductor chip 1 can be two or greater and the required number of switch circuits may be provided in a manner corresponding to the number of blocks to the extent that the area of the semiconductor chip is not increased.

In case where the semiconductor integrated circuit devices according to the respective embodiments of the invention as described above are used for electronic equipment such as personal computers, electronic equipment with power consumption being restrainable can be provided because only necessary portions are operated and because stabilized power supply voltage can be supplied to the semiconductor integrated circuit device.

The semiconductor integrated circuit device according to the invention has the effect of restraining not only block-to-block power supply potential variation but also a voltage drop of power supply potential in a block without increasing the area of a semiconductor chip, whereupon it is useful to restrain the block-to-block power supply voltage and so on.

What is clamed is:

1. A semiconductor integrated circuit device divided into a plurality of blocks including a first block and a second block, comprising:
   first power supply wiring for supplying power supply potential to the first block;
   second power supply wiring for supplying power supply potential to the second block;
   a first feeder terminal for supplying power to the first block via the first power supply wiring;
   a second feeder terminal for supplying power to the second block via the second power supply wiring; and
   a switch circuit disposed between the first power supply wiring and the second power supply wiring and used for deciding whether to connect the first power supply wiring and the second power supply wiring, wherein
   each of the first feeder terminal and the first power supply wiring, the first power supply wiring and the first block are directly connected,
   each of the second feeder terminal and the second power supply wiring, the second power supply wiring and the second block are directly connected, and
   the first feeder terminal and the second feeder terminal are connected to outside of the semiconductor integrated circuit device.

2. The semiconductor integrated circuit device as claimed in claim 1, wherein the first power supply wiring is connected to the second block via only the switch circuit;
   and the second power supply wiring is connected to the first block via only the switch circuit.

3. The semiconductor integrated circuit device as claimed in claim 1, wherein the switch circuit is disposed between the first block and the second block.

4. A semiconductor integrated circuit device as claimed in 1, wherein the switch circuit has:
   a first power supply connection terminal connected to the first power supply wiring;
   a second power supply connection terminal connected to the second power supply wiring;
   a power supply connecting portion for controlling the condition of connecting the first power supply connection terminal and the second power supply connection terminal, and a control portion for controlling the power supply connecting portion.

5. The semiconductor integrated circuit device as claimed in claim 4, wherein the control portion has an NAND circuit.

6. The semiconductor integrated circuit device as claimed in claim 4, the control portion controls the power supply connecting portion in proportion to the condition of the power supply potential supplied to the first block and/or the second block.

7. The semiconductor integrated circuit device as claimed in claim 4, wherein the control portion controls the power supply connecting portion in response to an electric signal exchanged between the first block and the second block.

8. The semiconductor integrated circuit device as claimed in claim 4, wherein the power supply connecting portion is formed with a P-type MOS transistor.

9. The semiconductor integrated circuit device as claimed in claim 4, wherein the power supply connecting portion is formed with a transfer gate.

10. The semiconductor integrated circuit device as claimed in claim 1, wherein the first block is a control block; and the second block is a memory block which is controlled by the control block.

11. The semiconductor integrated circuit as claimed in claim 4, wherein the power supply connecting portion forms capacitance in case that the first power supply wiring and the second power supply wiring are not connected.

12. The semiconductor integrated circuit as claimed in claim 4, wherein the power supply connecting portion is a transfer gate for forming capacitance in case that the first power supply wiring and the second power supply wiring are not connected.

13. The semiconductor integrated circuit as claimed in claim 12, wherein the control portion has a second transfer gate connected to the transfer gate for forming the capacitance.

14. Electronic equipment using the semiconductor integrated circuit device of claim 1.

15. A semiconductor integrated circuit device as claimed in claim 1, wherein a series of elements for supplying power from the first feeder terminal to the first block and a series of elements for supplying power from the second feeder terminal to the second block have no switch or MOS transistor.

16. A semiconductor integrated circuit device as claimed in claim 1, wherein a series of the elements for supplying power from the first feeder terminal to the first block and a series of the elements for supplying power from the second feeder terminal to the second block are each independent.

17. A semiconductor integrated circuit device divided into a plurality of blocks including a first block and a second block, comprising:
   first power supply wiring for supplying power supply potential to the first block;
   second power supply wiring for supplying power supply potential to the second block;
   a first feeder terminal for supplying power to the first block via the first power supply wiring;
   a second feeder terminal for supplying power to the second block via the second power supply wiring; and
   a switch circuit disposed between the first power supply wiring and the second power supply wiring and used for deciding whether to connect the first power supply wiring and the second power supply wiring, wherein
   each of the first feeder terminal and the first power supply wiring, the first power supply wiring and the first block are directly connected,
   each of the second feeder terminal and the second power supply wiring, the second power supply wiring and the second block are directly connected, and
   at least one of the first block and the second block can be set to a sleep mode.

18. The semiconductor integrated circuit device as claimed in claim 17, wherein the first power supply wiring is connected to the second block via only the switch circuit; and the second power supply wiring is connected to the first block via only the switch circuit.

19. The semiconductor integrated circuit device as claimed in claim 17, wherein the switch circuit is disposed between the first block and the second block.

20. A semiconductor integrated circuit device as claimed in 17, wherein the switch circuit has:
   a first power supply connection terminal connected to the first power supply wiring;
   a second power supply connection terminal connected to the second power supply wiring;
   a power supply connecting portion for controlling the condition of connecting the first power supply connection terminal and the second power supply connection terminal, and a control portion for controlling the power supply connecting portion.

21. The semiconductor integrated circuit device as claimed in claim 20, wherein the control portion has an NAND circuit.

22. The semiconductor integrated circuit device as claimed in claim 20, the control portion controls the power supply connecting portion in proportion to the condition of the power supply potential supplied to the first block and/or the second block.

23. The semiconductor integrated circuit device as claimed in claim 20, wherein the control portion controls the power supply connecting portion in response to an electric signal exchanged between the first block and the second block.

24. The semiconductor integrated circuit device as claimed in claim 20, wherein the power supply connecting portion is formed with a P-type MOS transistor.

25. The semiconductor integrated circuit device as claimed in claim 20, wherein the power supply connecting portion is formed with a transfer gate.

26. The semiconductor integrated circuit device as claimed in claim 17, wherein the first block is a control block; and the second block is a memory block which is controlled by the control block.

27. The semiconductor integrated circuit as claimed in claim 20, wherein the power supply connecting portion forms capacitance in case that the first power supply wiring and the second power supply wiring are not connected.

28. The semiconductor integrated circuit as claimed in claim 20, wherein the power supply connecting portion is a transfer gate for forming capacitance in case that the first power supply wiring and the second power supply wiring are not connected.

29. The semiconductor integrated circuit as claimed in claim 28, wherein the control portion has a second transfer gate connected to the transfer gate for forming the capacitance.

30. Electronic equipment using the semiconductor integrated circuit device of claim 17.

31. A semiconductor integrated circuit device as claimed in claim 17, wherein a series of elements for supplying power from the first feeder terminal to the first block and a series of elements for supplying power from the second feeder terminal to the second block have no switch or MOS transistor.

32. A semiconductor integrated circuit device as claimed in claim 17, wherein a series of the elements for supplying power from the first feeder terminal to the first block and a series of the elements for supplying power from the second feeder terminal to the second block are each independent.

* * * * *